(12) United States Patent
Sato et al.

(10) Patent No.: US 7,655,864 B2
(45) Date of Patent: **\*Feb. 2, 2010**

(54) PHOTOSENSITIVE CONDUCTIVE PASTE FOR ELECTRODE FORMATION AND ELECTRODE

(75) Inventors: Atsuhiko Sato, Kawasaki (JP); Terry Roland Suess, Raleigh, NC (US)

(73) Assignee: E.I du Pont de Nemours and Company, Wilmington, DE (US)

( * ) Notice: Subject to any disclaimer, the term of this patent is extended or adjusted under 35 U.S.C. 154(b) by 436 days.

This patent is subject to a terminal disclaimer.

(21) Appl. No.: 11/485,702

(22) Filed: Jul. 13, 2006

(65) Prior Publication Data

US 2008/0012490 A1    Jan. 17, 2008

(51) Int. Cl.
*H01R 4/18* (2006.01)
(52) U.S. Cl. .................................... 174/94 R
(58) Field of Classification Search ............. 174/94 R
See application file for complete search history.

(56) References Cited

U.S. PATENT DOCUMENTS

| | | | |
|---|---|---|---|
| 2,760,863 A | 8/1956 | Plambeck, Jr. | |
| 2,850,445 A | 9/1958 | Oster | |
| 2,875,047 A | 2/1959 | Oster | |
| 2,927,022 A | 3/1960 | Martin et al. | |
| 3,074,974 A | 1/1963 | Gebura | |
| 3,097,096 A | 7/1963 | Oster | |
| 3,097,097 A | 7/1963 | Oster et al. | |
| 3,145,104 A | 8/1964 | Oster et al. | |
| 3,380,381 A | 4/1968 | Musgrave | |
| 3,427,161 A | 2/1969 | Laridon et al. | |
| 3,479,186 A | 11/1969 | Taylor et al. | |
| 3,549,367 A | 12/1970 | Chang et al. | |
| 3,583,931 A | 6/1971 | Bouchard | |
| 4,162,162 A | 7/1979 | Dueber | |
| 5,032,490 A | 7/1991 | Nebe et al. | |
| 5,049,480 A * | 9/1991 | Nebe et al. | ............... 430/281.1 |

FOREIGN PATENT DOCUMENTS

| | | |
|---|---|---|
| EP | 0 863 534 A2 | 9/1998 |
| JP | 10-073233 A | 3/1989 |
| JP | 2003-195487 | 7/2003 |
| JP | 195487 A | 7/2003 |
| JP | 3479463 | 12/2003 |
| JP | 2004-158456 | 3/2004 |
| JP | 3510761 | 3/2004 |
| JP | 3541125 | 4/2004 |
| JP | 3538387 | 6/2004 |
| JP | 3538408 | 6/2004 |
| WO | WO 0203766 A2 | 1/2002 |
| WO | WO 03/010602 A1 | 2/2003 |
| WO | WO 2004/072736 A1 | 8/2004 |

OTHER PUBLICATIONS

PCT International Search Report and Written Opinion for International Application No. PCT/US2007/016043 dated Jun. 9, 2008.

* cited by examiner

*Primary Examiner*—Chau N Nguyen

(57) ABSTRACT

A photosensitive conductive paste for electrode formation containing conductive metal particles, a glass binder, a monomer, a photoinitiator, an organic polymer binder, an organic medium and an ultraviolet absorber which does not substantially change reflectance of a paste in a visible light range.

11 Claims, 4 Drawing Sheets

PHOTOSENSITIVE CONDUCTIVE PASTE FOR ELECTRODE FORMATION AND ELECTRODE

BACKGROUND OF THE INVENTION

1. Field of the Invention

The present invention relates to an electrode of a plasma display panel (PDP). More particularly, the present invention relates to a technology for improving exposure latitude and imparting improved PDP quality by modifying a photo-patternable paste.

2. Technical Background

In PDP's, 1000 or more electrodes measuring 80 to 100 μm in width by 0.5 to 1.5 m in length are formed. These electrodes are preferred to be free of defects and have superior linearity. Silver is typically used for the conductive metal particles contained in the electrodes.

Photolithography has recently become widely used to form the electrodes in PDP. In this method, a photo-patternable paste is first coated. A pattern is then formed by exposing and developing a film composed of the photo-patternable paste. Accompanying the increased size of glass substrates in recent years, proximity exposure has come to be used during exposure. Proximity exposure refers to a system whereby exposure is carried out while providing a gap of several hundred micrometers between a photomask and the coated film to be exposed.

In the case of pattern formation using a photo-patternable paste, it is desirable to increase the process latitude. It is desirable to increase the degree of freedom of the exposure conditions. In the case of low process latitude, the pattern shape may change easily depending on the exposure conditions, or the width of the electrodes may become uneven. Photosensitivity to changes in the pattern shape depending on exposure conditions signifies a low degree of freedom, and may even lead to restrictions on the production process. When carrying out proximity exposure, in particular, the width of the electrode formed tends to be greater than the designed electrode width, resulting in the decrease of sharpness of image. Measures to avoid this decrease in sharpness are needed.

Japanese Patent Application Laid-open No. 2003-195487 discloses a technology in which an ultraviolet absorber is added for the purpose of forming a fine, sharp transparent electrode. According to this publication, addition of the ultraviolet absorber makes it possible to diminish scattering of exposure light within the paste. Examples of ultraviolet absorbers include azo-based dyes, amino ketone-based dyes, xanthene-based dyes, quinoline-based dyes, anthraquinone-based dyes, benzophenone-based dyes, diphenylcyanoacrylate-based dyes, triazine-based dyes and p-aminobenzoic acid-based dyes.

However, if a dye-based ultraviolet absorber like that disclosed in Japanese Patent Application Laid-open No. 2003-195487 is used, since the ultraviolet absorber itself absorbs light, the paste that is produced is also colored. In a process for producing a PDP using a conductive paste, defect inspections are frequently carried out using visible light to confirm the coated state of the paste. At this time, if a dye which absorbs visible light is contained in the paste, there is the possibility of locations where defects are not present being detected. In addition, if the absorbance of visible light changes as a result of adding an ultraviolet absorber, there is the risk of having a detrimental effect on the efficiency of the photoinitiator. For example, since some photoinitiators have an absorbance range in the vicinity of up to 450 nm, in the case of using such a photoinitiator, a change in the absorbance in that range also ends up having an effect on the reflection efficiency of the photoinitiator.

SUMMARY OF THE INVENTION

An object of the present invention is to provide a means capable of preventing the occurrence of the above-mentioned problems while also realizing high pattern resolution.

The present invention relates to a photosensitive conductive paste for pattern formation comprising: conductive metal particles, a glass binder, a monomer, a photoinitiator, an organic polymer binder, an organic medium and an ultraviolet absorber which does not substantially change the reflectance of the paste in the visible light range.

In addition, the present invention relates to an electrode formed using the conductive paste.

In addition, the present invention relates to a PDP having the above-mentioned electrode.

In addition, the present invention relates to a method for forming an electrode comprising the steps of: coating a photosensitive conductive paste for electrode formation on a substrate, said photosensitive conductive paste for electrode formation comprising conductive metal particles, a glass binder, a monomer, a photoinitiator, an organic polymer binder, an organic medium and an ultraviolet absorber which does not substantially change the reflectance of the paste in the visible light range; drying the coated conductive paste; exposing a film formed by drying the conductive paste using a photomask; obtaining an electrode pattern by developing the exposed film; and firing the resulting electrode pattern.

In the present invention, high pattern resolution is achieved by using an ultraviolet absorber. Moreover, there is little change in the optical characteristics of the paste in the visible light range caused by the addition of the ultraviolet absorber. Consequently, there is little occurrence of defect recognition errors in defect inspections using visible light.

Moreover, since the ultraviolet absorber causes little change in absorbance in the visible light range, effects on the reaction efficiency of the photoinitiator are also prevented.

DETAILED DESCRIPTION OF THE INVENTION

Figure 1:
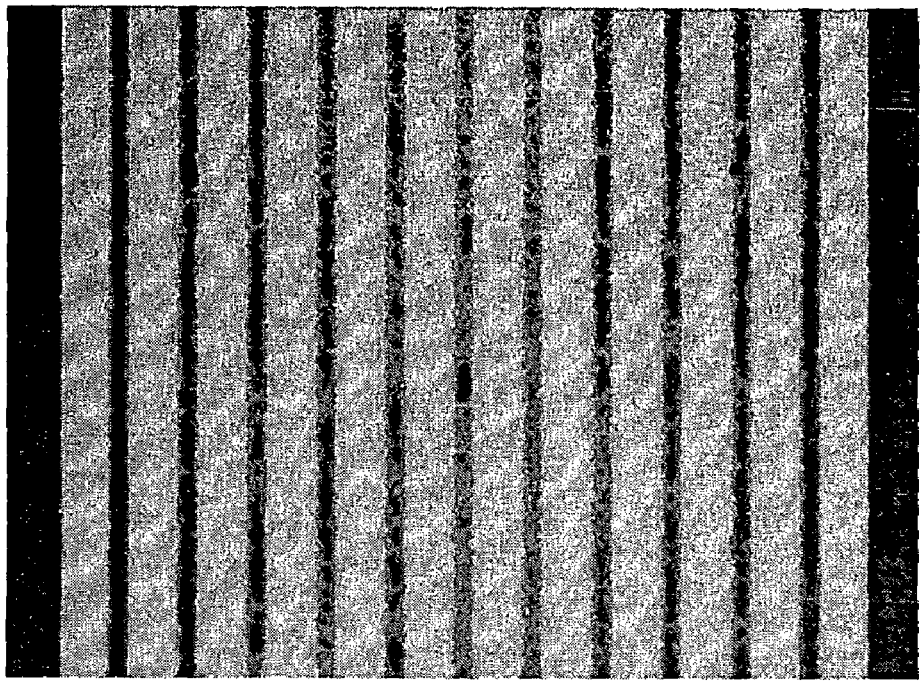
FIG. 1 is a photograph showing a general view of an electrode pattern formed using Sample 1.

A first aspect of the present invention relates to a photosensitive conductive paste for electrode formation comprising: conductive metal particles, a glass binder, a monomer, a photoinitiator, an organic polymer binder, an organic medium and an ultraviolet absorber which does not substantially change the reflectance of the paste in the visible light range.

The paste of the present invention is a photo-patternable paste. In other words, polymerization is induced by a photoinitiator as a result of coating a paste followed by exposure at a predetermined site. Normally, ultraviolet light is used. A pattern is formed by utilizing the difference in resolution between the site where polymerization progresses and the site where it does not.

It is preferred that optical scattering be low in the conductive paste surface layer and inside the conductive paste in order to improve resolution in photosensitive processes. If optical scattering occurs in the surface layer and inside the conductive paste, polymerization ends up proceeding even at sites which are not exposed, thereby resulting in pattern width deviating from the desired width. In extreme cases, adjacent lines end up being connected.

In the present invention, an ultraviolet absorber is contained in the paste. The ultraviolet absorber prevents scattering of exposure light in the surface layer and within the paste, thereby resulting in the formation of a pattern of a desired shape, i.e. a pattern having high resolution.

The addition of an ultraviolet absorber increases the degree of freedom of the exposure conditions. This advantage is extremely significant in actual production settings. In the case of carrying out proximity exposure, inhibiting increases in pattern width by adding an ultraviolet absorber is particularly effective. The use of silver for the conductive metal particles in particular is extremely effective in the case of carrying out proximity exposure. Since silver has high light reflectance, although pattern width increases easily in the case of having carried out proximity exposure, applying the present invention realizes high resolution even in the case of carrying out proximity exposure using a silver paste.

There are no particular limitations on the gap when carrying out proximity exposure. The present invention can be applied to proximity exposure of, for example, 150 μm or more, or proximity exposure of 300 μm or more.

In the present invention, the ultraviolet absorber does not substantially change the reflectance of the paste in the visible light range. Here, "does not substantially change" means that the shape of the reflective spectrum of the paste is not affected by the addition of ultraviolet absorber. The presence or absence of change can be judged by comparing, e.g. by preparing an identical paste with the exception of the ultraviolet absorber, and comparing the reflective spectrum between the reflectance of a paste not containing ultraviolet absorber (R-Before: %) with the reflectance of a paste containing ultraviolet absorber (R-After: %). More specifically, the difference between R-Before and R-After is preferably less than 5%, and more preferably less than 3%, over the entire visible light range. Furthermore, the visible light range in the present invention refers to the range from 400 to 700 nm.

A reason for using reflectance as a criterion for evaluating optical characteristics in the present invention is because defects are detected using reflected light in defect inspection equipment.

The use of this type of ultraviolet absorber prevents recognition errors in defect inspections which are caused by ultraviolet absorbers. In addition, since the amount of change in optical characteristics in the visible light range accompanying the addition of an ultraviolet absorber is small, effects of the reaction efficiency of the photoinitiator are also prevented.

Continuing, an explanation is sequentially provided of the constituent components of the photosensitive conductive paste for electrode formation. The components indicated below can be used for the components other than the ultraviolet absorber. However, the indicated components are only examples, and other components may also be used. In addition, said components may also be substituted with newly developed components or newly developed components may be added.

(A) Conductive Metal Particles

Conductive metal particle gives conductivity to an electrode formed from a paste of the present invention. Such conductive metal includes gold, silver, platinum, palladium, copper and combinations thereof. Virtually any shape metal powder, including spherical particles and flakes (rods, cones, and plates) may be used in the compositions of the present invention. The preferred metal powders are selected from the group comprising gold, silver, palladium, platinum, copper and combinations thereof. The most preferred metal powder is silver. Silver is commonly available and inexpensive. The sintering temperature for silver is relatively low compared with other metal like gold. Furthermore, it is possible to sinter silver metal under the oxygen-containing atmosphere such as air condition. It is preferred that the particles be spherical. It is preferred that at least 80 percent by weight of the conductive metal particle fall within the 0.5-10 μm range.

Based on the overall paste weight, the conductive metal particle content is typically 50-80 wt %.

(B) Glass Binder (Glass Frit)

The glass binder (glass frit) used in the present invention promotes the sintering of conductive component particles.

The glass binder used in the present invention is preferably a lead-free and cadmium-free Bi based amorphous, low-melting glass binder from environmental point of view. Other lead-free, low-melting glasses are P based or Zn—B based compositions. However, P based glass does not have good water resistance, and Zn—B glass is difficult to obtain in the amorphous state, hence Bi based glasses are preferred. Bi glass can be made to have a relatively low melting point without adding an alkali metal and has little problems in making a powder. In the present invention, Bi glass having the following characteristics is most preferred.

Explained below is a preferred embodiment of glass composition. However, the present invention is not limited to the following specific composition.

| (I) Glass composition | |
|---|---|
| 55–85 wt % | $Bi_2O_3$ |
| 0–20 wt % | $SiO_2$ |
| 0–5 wt % | $Al_2O_3$ |
| 2–20 wt % | $B_2O_3$ |
| 0–20 wt % | ZnO |
| 0–15 wt % | one or more of oxides selected from BaO, CaO, and SrO (in the case of an oxide mixture, the maximum total is up to 15 wt %). |
| 0–3 wt % | one or more of oxides selected from $Na_2O$, $K_2O$, $Cs_2O$ and $Li_2O$ (in the case of an oxide mixture, the maximum total is up to 3 wt %). |

Based on the overall paste weight, the glass binder content is typically 1-10 wt %. When the glass binder content is too small, bonding to the substrate is weak.

(C) Monomer

The monomer component used in the present invention includes a compound containing at least one polymerizable ethylene group and a compound containing at least one addition-polymerizable ethylenically unsaturated group. The monomer is polymerized by the exposure of light.

The chain-extending addition polymerization of these compounds is induced by free radicals. The monomeric compounds are not gaseous, i.e., having boiling point higher than 100° C. The monomeric compounds have plasticizing effects on the organic polymeric binders.

Preferred monomers that can be used alone or in combination with other monomers include t-butyl (meth)acrylate, 1,5- pentanediol di(meth)acrylate, N,N-dimethylaminoethyl (meth)acrylate, ethylene glycol di(meth)acrylate, 1,4-butanediol di(meth)acrylate, diethylene glycol di(meth)acrylate, hexamethylene glycol di(meth)acrylate, 1,3-propanediol di(meth)acrylate, decamethylene glycol di(meth)acrylate, 1,4-cyclohexanediol di(meth)acrylate, 2,2-dimethylolpropane di(meth)acrylate, glycerol di(meth)acrylate, tripropylene glycol di(meth)acrylate, glycerol tri(meth)acrylate, trimethylolpropane tri(meth)acrylate, compounds described in U.S. Pat. No. 3,380,381, 2,2-di(p-hydroxyphenyl)propane di(meth)acrylate, pentaerythritol tetra(meth)acrylate, triethylene glycol diacrylate, polyoxyethylene-1,2-di(p-hydroxyethyl)propane dimethacrylate, bisphenol A di[3-(meth)acryloyloxy-2-hydroxypropyl]ether, bisphenol A di[2-(meth)acryloyloxyethyl]ether, 1,4-butanediol di(3-methacryloyloxy-2-hydroxypropyl)ether, triethylene glycol dimethacrylate, polyoxyporpyltrimethylolpropane triacrylate, butylenes glycol di(meth)acrylate, 1,2,4-butanediol [sic] tri(meth)acrylate, 2,2,4-trimethyl-1,3-pentanediol di(meth) acrylate, 1-phenylethylene 1,2-dimethacrylate, diallyl fumarate, styrene, 1,4-benzenediol dimethacrylate, 1,4-diisopropenylbenzene, and 1,3,5-triisopropenylbenzene [(meth)acrylate means both acrylate and methacrylate].

Useful are ethylenically unsaturated compounds having molecular weights below 300, e.g., an alkylene or polyalkylene glycol diacrylate prepared from an alkylene glycol or polyalkylene glycol, such as a 1-10 ether bond-containing $C_{2-15}$ alkylene glycol, and those described in U.S. Pat. No. 2,927,022, such as those containing a terminal addition-polymerizable ethylene bond.

Other preferred monomers are polyoxyethylenated trimethylolpropane tri(meth)acrylate, ethylated pentaerythritol acrylate, trimethylolpropane tri(meth)acrylate, dipentaerythritol monohydroxypentacrylate, and 1,10-decanediol dimethacrylate.

Other preferred monomers are monohydroxypolycaprolactone monoacrylate, polyethylene glycol diacrylate (molecular weight: about 200), and polyethylene glycol dimethacrylate (molecular weight: about 400). The unsaturated monomer component content is 1-20 wt % based on the overall weight of the dry photopolymerizable layer.

Other useful monomers are disclosed in U.S. Pat. No. 5,032,490, incorporated herein by reference.

Based on the overall paste weight, the monomer content is typically about 3-10 wt %.

(D) Photoinitiators

Suitable photoinitiators are thermally inert but generate free radicals when exposed to actinic radiation at a temperature below 185° C. These photoinitiators are compounds having two intramolecular rings inside a conjugated carbon ring system and include (un)substituted polynuclear quinines, e.g., 9,10-anthraquinone, 2-methylanthraquinone, 2-ethylanthraquinone, 2-t-butylanthraquinone, octamethylanthraquinone, 1,4-naphthoquinone, 9,10-phenanthrenequinone, benz[a]anthracene-7,12-dione, 2,3-naphthacene-5, 12-dione, 2-methyl-1,4-naphthoquinone, 1,4-dimethylanthraquinone, 2,3-dimethylanthraquinone, 2-phenylanthraquinone, 2,3-diphenylanthraquinone, retenquinone [transliteration], 7,8,9,10-tetrahydronaphthacene-5, 12-dione, and 1,2,3,4-tetrahydrobenz[a]anthracene-7,12-dione. Other useful photoinitiators are described in U.S. Pat. No. 2,760,863 [Of these, some are thermally active at a low temperature of 85° C., such as vicinal ketaldonyl alcohols, e.g., benzoin and pivaloin; acyloin ethers such as benzoin methyl or ethyl ether; α-methylbenzoin, α-allylbenzoin, α-phenylbenzoin, thioxanthone and its derivatives, hydrogen donors, hydrocarbon-substituted aromatic acyloin, etc.]

Based on the overall paste weight, the photoinitiator content is typically about 5-15 wt %.

(E) Organic Polymer Binders

The polymeric binders are important in the compositions of the present invention and are preferred to be selected considering the water developability and high resolution. Such requirements are satisfied by the following binders. Such binders may be copolymers and interpolymers (mixed polymers) made from (1) non-acidic comonomers such as $C_{1-10}$ alkyl acrylates, $C_{1-10}$ alkyl methacrylates, styrene, substituted styrene, or combinations thereof, and (2) acidic comonomers including an ethylenically unsaturated carboxylic acid in at least 15 wt % of the total polymer weight.

With such an acidic functional group, development in an aqueous base such as a 0.4 wt % sodium carbonate aqueous solution is possible. If the acidic comonomer content is less than 15 wt %, the composition may not be washed off completely by the aqueous base. If the acidic comonomer content is above 30%, the composition has low stability under the development conditions and the image area is only partially developed. Suitable acidic comonomers may be ethylenically unsaturated monocarboxylic acids such as acrylic acid, methacrylic acid, crotonic acid, etc.; ethylenically unsaturated dicarboxylic acids such as fumaric acid, itaconic acid, citraconic acid, vinylsuccinic acid, maleic acid, etc., their half esters (hemiesters), as well as sometimes their anhydrides and mixtures. For clean burning under a low-oxygen atmosphere, methacrylic polymers are preferred over acrylic polymers.

When the non-acidic comonomers are alkyl acrylates or alkyl methacrylates described above, the non-acidic comonomer content in the polymeric binders is preferred to be typically at least 50 wt %, preferably 70-75 wt %. When the non-acidic comonomers are styrene or substituted styrene, the non-acidic comonomer content in the polymeric binder is preferred to be typically 50 wt %, with the remaining 50 wt % being an acid anhydride such as maleic anhydride hemiester. The preferred substituted styrene is α-methylstyrene.

While not preferred, the non-acidic portion of the polymeric binder may contain less than about 50 wt % of other non-acidic comonomers substituting the alkyl acrylate, alkyl methacrylate, styrene, or substituted styrene portion of the polymer. For example, they include acrylonitrile, vinyl acetate, and acrylamide. However, in such cases, complete combustion is more difficult, thus such a monomer content should be less than about 25 wt % of the overall polymeric binder weight. Binders may consist of a single copolymer or combinations of copolymers fulfilling various standards described above. In addition to the copolymers described above, other examples include polyolefins such as polyethylene, polypropylene, polybutylene, polyisobutylene, ethylene-propylene copolymer, etc., as well as polyethers such as lower alkylene oxide polymers including polyethylene oxide.

These polymers can be prepared by solution polymerization technology commonly used in the acrylic acid ester polymerization field.

Typically, the acidic acrylic acid ester polymers described above can be obtained by mixing an α- or β-ethylenically unsaturated acid (acidic comonomer) with one or more copolymerizable vinyl monomers (non-acidic comonomer) in an organic solvent having a relatively low boiling point (75-150° C.) to obtain a 10-60% monomer mixture solution, then adding a polymerization catalyst to the monomer, followed by polymerization. The resulting mixture is heated under ambient pressure at the reflux temperature of the solvent. After completion of the polymerization reaction, the resulting acidic polymer solution is cooled to room temperature. A sample is recovered and measured for the polymer viscosity, molecular weight, and acid equivalent.

The acid-containing polymeric binder described above is preferred to have a molecular weight below 50,000.

When such compositions are coated by screen printing, the polymeric binder is preferred to have a Tg (glass transition temperature) exceeding 60° C.

Based on the overall paste weight, the polymer binder content is typically 10-30 wt %.

(F) Organic Medium

The organic medium is mainly used for the easy coating of dispersions containing a finely pulverized composition on ceramics and other substrates. Thus, first, the organic medium is preferred to be capable of dispersing the solid components in a stable manner and, second, the rheological property of the organic medium is to impart good coatability to the dispersion.

In the organic medium, the solvent component that may be a solvent mixture is preferred to be selected from those capable of complete dissolution of polymers and other organic components. The solvents are selected from those that are inert (not reactive) with respect to the paste composition components. Solvents are selected from those that have a sufficiently high volatility, thus evaporate well from the dispersion even when coated under ambient pressure at a relatively low temperature, while in the case of the printing process, the volatility is preferred not be too high, causing rapid drying of the paste on the screen at room temperature. Solvents that can be favorably used in the paste compositions is preferred to have boiling point below 300° C. under ambient pressure, preferably below 250° C. Such solvents may be aliphatic alcohols or their esters such as acetic acid esters or propionic acid esters; terpenes such pine resin, α- or β-terpineol, or mixtures thereof; ethylene glycol, ethylene glycol monobutyl ether, and ethylene glycol esters such as butyl Cellosolve acetate; butyl Carbitol and Carbitol esters such as butyl Carbitol acetate and Carbitol acetate; Texanol (2,2,4-trimethyl-1,3-pentanediol monoisobutyrate), and other suitable solvents.

Based on the overall paste weight, the organic medium content is typically about 20-40 wt %.

(G) Ultraviolet Absorber

As was previously described, an ultraviolet absorber is used that substantially does not change the reflectance of the paste in the visible light range. The ultraviolet absorber is preferably an organic compound. The use of an organic compound makes it possible to prevent the electrical characteristics of the electrode from being affected by the addition of the ultraviolet absorber since the compound disappears and does not remain in the electrode in the sintering process.

Specific examples of ultraviolet absorbers include benzotriazole derivatives and hydroxyphenyltriazine derivatives. These ultraviolet absorbers have little effect on the conductivity of the electrode following sintering. A commercially available compound can also be used for the ultraviolet absorber. An example of a commercially available compound which can be used is Tinuvin® 109 manufactured by Ciba.

The amount of ultraviolet absorber added is preferably controlled according to the ultraviolet absorber used. If ultraviolet absorption effects by the ultraviolet absorber are excessively great, the exposure light is unable to adequately reach beneath the coated paste, thereby resulting in the risk of the pattern shape deviating from the desired size. Conversely, if the added amount is insufficient, there is the risk of the effects of the ultraviolet absorber being unable to be adequately obtained. In consideration of these factors, the optimum amount is determined corresponding to the ultraviolet absorber used.

For example, the amount of a benzotriazole derivative added is preferably 0.1 to 0.5 wt %, and more preferably 0.15 to 0.25 wt %, based on the overall paste weight. The amount of a hydroxyphenyltriazine derivative added is preferably 0.2 to 1.0 wt %, and more preferably 0.3 to 0.5 wt %.

(H) Additional Components

Dispersants, stabilizers, plasticizers, releases, stripping agents, defoamers, wetting agents, etc., are known in the art. Common materials are disclosed in U.S. Pat. No. 5,032,490 herein incorporated by reference.

The paste of the present invention is used for form an electrode. For example, it is used to form an electrode of a plasma display panel (PDP). Although PDP have back panel electrodes and front panel electrodes, the present invention can be applied to either thereof. Since known technologies can be applied with respect to PDP structure and PDP production methods, an explanation thereof is omitted here.

A second aspect of the present invention is a method for forming an electrode comprising the steps of: coating a photosensitive conductive paste for electrode formation on a substrate, said photosensitive conductive paste for electrode formation comprising conductive metal particles, a glass binder, a monomer, a photoinitiator, an organic polymer binder, an organic medium and an ultraviolet absorber which does not substantially change the reflectance of the paste in the visible light range; drying the coated conductive paste; exposing a film formed by drying the conductive paste using a photomask; obtaining an electrode pattern by developing the exposed film; and firing the resulting electrode pattern.

Although the method for forming an electrode using a conventional conductive paste is a known technology, the following provides a brief explanation of a summary thereof.

First, a photosensitive conductive paste for electrode formation, comprising conductive metal particles, a glass binder, a monomer, a photoinitiator, an organic polymer binder, an organic medium and an ultraviolet absorber which does not substantially change the reflectance of the paste in the visible light range, is coated onto a substrate. Since the conductive paste is as was previously described, an explanation thereof is omitted here.

The substrate on which the conductive paste is coated may be selected corresponding to the application. For example, in the case of forming a back panel electrode of a PDP, the paste is coated onto a back glass panel. The entire surface is coated by screen printing, for example, during coating.

Next, the coated conductive paste is dried. Although there are no particular limitations on the drying conditions provided the conductive paste is able to be dried, the conductive paste may be dried, for example, for 10 to 20 minutes at 100° C. In addition, drying can be carried out using, for example, a conveyor-type infrared dryer. The electrode thickness after drying is normally 8 to 10 μm in a PDP.

The film of the dried conductive paste is exposed using a photomask. The photomask has an electrode pattern which is desired to be formed, and light is radiated onto the desired pattern by exposing through the photomask. There are no particular limitations on the wavelength of the light used during exposure, and the i-line (365 nm), for example, can be used. Exposure conditions vary according to the components of the paste used, the film thickness thereof and so forth. Although there are no particular limitations on the exposure level, it is normally from 100 to 1000 mJ/cm$^2$.

In the present invention, the step for exposing the film is preferably proximity exposure. The effects obtained by the ultraviolet absorber are significant in proximity exposure. The effects of the present invention are particularly significant in the case of proximity exposure at a gap of 300 μm or more. In addition, the present invention is significant in the case of using silver for the conductive metal particles as previously described.

Continuing, a pattern is obtained by developing the exposed film. Development can be carried out with an alkaline solution. A 0.4% aqueous sodium carbonate solution, for example, can be used for the alkaline solution. A developed electrode pattern can be obtained by using a means such as spraying this type of alkaline solution onto the film on the substrate, or immersing the substrate having the exposed film into an alkaline solution.

Finally, the developed electrode pattern is fired. Firing can be carried out in a firing oven having a predetermined temperature profile. The maximum temperature during firing is preferably 400 to 600° C., and more preferably 500 to 600° C. The firing time is preferably 1 to 3 hours. After firing, an electrode having a desired pattern is obtained by cooling. The thickness of the electrode after drying is normally 4 to 5 μm.

EXAMPLES

1. Confirmation of Effects of Ultraviolet Absorber

Example 1

8 parts by weight of an organic resin binder capable of being developed with an aqueous alkaline solution (copolymer of methyl methacrylate and methacrylic acid, acid value: 120 mgKOH/g, weight average molecular weight: 6400), 1.2 parts by weight of a photoinitiator (1:1 mixture of 2-methyl-1-[4-(methylthio)phenyl]-2-morpholinopropan-1-one and ethyl-4-dimethylaminobenzoate), 0.5 parts by weight of a photosensitizer (2,4-diethylthioxanthone), 0.3 parts by weight of a thickener (copolymer of polyvinyl pyrrolidone and vinyl acetate), and 0.02 parts by weight of a thermal polymerization inhibitor (1,4,4-trimethyl-2,3-diazobicyclo[3.2.2]non-2-ene-N,N'-dioxide) were dissolved in 16 parts by weight of an organic medium (texanol). 6 parts by weight of a reactive monomer (trimethylol propane triacrylate), 0.2 parts by weight of a viscosity stabilizer (malonic acid), 2.2 parts by weight of a glass binder (softening point: 550° C., average particle diameter: 0.8 μm, $Bi_2O_3$—$SiO_2$—$B_2O_3$) and 66 parts by weight of conductive metal particles in the form of silver particles (specific surface area: 0.5 $m^2$/g) were added to this solution and stirred. Subsequently, the mixture was formed into a paste by kneading with a three-roll mixer. 1 part by weight of an ultraviolet absorber (Ciba®: Tinuvin® 109, 1:1 mixture of octyl-3-[3-tert-butyl-4-hydroxy-5-(5-chloro-2H-benzotriazol-2-yl)phenyl]propionate and 2-ethylhexyl-3-[3-ter-butyl-4-hydroxy-5-(chloro-2H-benzotriazol-2-yl)phenyl]propionate) was added to the resulting paste followed by stirring to obtain a photosensitive conductive paste for electrode formation. This ultraviolet absorber is an ultraviolet absorber which does not substantially change the reflectance of the paste in the visible light range.

Example 2

A photosensitive conductive paste for electrode formation was obtained in the same manner as Example 1 with the exception of using Tinuvin® 400 (Ciba®, 2-(2H-benzotriazol-2-yl)-6-(1-methyl-1-phenylethyl)-4-(1,1,3,3-tetramethylbutyl)phenol) for the ultraviolet absorber. This ultraviolet absorber is an ultraviolet absorber which does not substantially change the reflectance of the paste in the visible light range.

Comparative Example 1

A photosensitive conductive paste for electrode formation was obtained in the same manner as Example 1 with the exception of not adding an ultraviolet absorber.

Evaluation

PDP electrodes were produced under the following process conditions using the pastes of Example 1, Example 2 and Comparative Example 1 followed by an evaluation of the characteristics thereof. The results are shown in Table 1. Table 1 shows the difference between line width in the case of carrying out proximity exposure at a gap of 300 μm and line width in the case of carrying out proximity exposure at gap of 500 μm.

i) Coating: Coating was carried out by printing with a 400 stainless steel mesh screen on a high strain point glass substrate measuring 5 cm×7.5 cm.

ii) Drying: Drying was carried out by maintaining at a temperature of 100° C. for 15 minutes in an IR oven.

iii) Exposure: Proximity exposure was carried out with an ultraviolet exposure device equipped with a high-pressure mercury lamp for the light source under two sets of conditions consisting of off contact amounts of 300 μm and 500 μm. Negative masks having line groups of 10 μm to 80 μm were used for the photomasks. The cumulative exposure level was 600 mJ/$cm^2$.

iv) Development: Development was carried out for 17 seconds in a 0.4% aqueous sodium carbonate solution maintained at a temperature of 30° C. using a conveyor-type developer. The developing time (17 seconds) was made to be roughly twice the amount of time (break) required to remove the film from the unexposed portion.

v) The resolution of the developed lines and the line widths were measured using a light microscope type of length measuring instrument to estimate the line width aberration from the exposure mask.

TABLE 1

| | Comparative Example 1 | Example 1 | Example 2 |
|---|---|---|---|
| Difference in line widths (300 μm vs. 500 μm) | +16 μm | ±0 μm | +11 μm |

Normally, when the distance between the mask and film during exposure increases as in Comparative Example 1, exposure blurring increases, and the line width becomes greater than the design line width of the original mask. In Example 1, the line width remained constant regardless of the distance between the mask and film. In addition, also in Example 2, the amount of change in the line width was less than that in Comparative Example 1. On the basis of these results, the present invention was suggested to suffer little increase in line width, namely improve the degree of freedom of the production process, even if the gap of proximity exposure is increased.

2. Effect of Added Amount of Ultraviolet Absorber

Example 3

A photosensitive conductive paste for electrode formation was obtained in the same manner as Example 1 with the exception of changing the amount of ultraviolet absorber (Tinuvin® 109, Ciba®) to 0.5 parts by weight.

Example 4

A photosensitive conductive paste for electrode formation was obtained in the same manner as Example 1 with the exception of changing the amount of ultraviolet absorber (Tinuvin® 109, Ciba®) added to 0.2 parts by weight.

Example 5

A photosensitive conductive paste for electrode formation was obtained in the same manner as Example 1 with the exception of changing the amount of ultraviolet absorber (Tinuvin® 109, Ciba®) added to 0.1 parts by weight.

Example 6

A photosensitive conductive paste for electrode formation was obtained in the same manner as Example 1 with the exception of changing the amount of ultraviolet absorber (Tinuvin® 109, Ciba®) added to 0.05 parts by weight.

Evaluation

PDP electrodes were produced under the following process conditions using the pastes of Examples 1, 3, 4, 5 and 6 and Comparative Example 1 followed by an evaluation of the characteristics thereof. The results are shown in Table 2.

i) Coating: Coating was carried out by printing with a 400 stainless steel mesh screen on a high strain point glass substrate measuring 5 cm×7.5 cm.

ii) Drying: Drying was carried out by maintaining at a temperature of 100° C. for 15 minutes in an IR oven.

iii) Exposure: Proximity exposure was carried out with an ultraviolet exposure device equipped with a high-pressure mercury lamp for the light source under two sets of conditions consisting of off contact amounts of 300 μm and 500 μm. Negative masks having line groups of 10 μm to 80 μm were used for the photomasks. The cumulative exposure level was 600 mJ/cm².

iv) Development: Development was carried out for 17 seconds (break×2) in a 0.4% aqueous sodium carbonate solution maintained at a temperature of 30° C. using a conveyor-type developer.

v) Firing: Firing was carried out for a total of 1 hour by maintaining at a temperature of 580° for 10 minutes using a roller hearth type of firing oven.

vi) The line widths after firing were measured using a light microscope type of length measuring instrument to estimate firing contraction characteristics in the horizontal direction.

vii) The total fired line cross-sectional area was measured using a contact-type surface roughness gauge to estimate firing contraction characteristics in the vertical direction and the warped shape of the line edges.

TABLE 2

Line Width Aberration Between 70 μm Lines of A Silver Single Layer Portion and Mask

|  | Example 1 | Example 3 | Example 4 | Example 5 | Example 6 | Comp. Example 1 |
|---|---|---|---|---|---|---|
| Added amount of ultraviolet absorber in photosensitive conductive paste (part by weight) | 1.0 | 0.5 | 0.2 | 0.1 | 0.05 | None |
| After developing at off contact of 300 μm | −8 μm | 10 μm | 23 μm | 26 μm | 36 μm | 56 μm |
| After developing at off contact of 500 μm | −25 μm | 20 μm | 37 μm | 47 μm | 61 μm | 80 μm |
| After developing at off contact of 300 μm | −26 μm | −7 μm | −5 μm | −1 μm | 2 μm | 33 μm |
| After developing at off contact of 500 μm | −37 μm | 1 μm | 8 μm | 14 μm | 18 μm | 58 μm |

As is shown in Table 2, the degree of freedom of exposure conditions was confirmed to be increased by the addition of ultraviolet absorber. Furthermore, although changes in electrical resistance between the examples and comparative example were investigated to confirm the effects on electrical resistance values during addition of ultraviolet absorber, there were no effects observed.

3. Reflectance Evaluation of Ultraviolet Absorber

The following five types of samples were prepared to investigate the effects of the ultraviolet absorber on the reflectance of the paste.

Sample 1: No ultraviolet absorber
Sample 2: Tinuvin® 109
Sample 3: Basic Blue 7 (triphenylmethane-based blue dye)
Sample 4: Basic Blue 41 (azo-based dye)
Sample 5: Basic Blue 54 (azo-based dye)

Electrode patterns were formed in the same manner as Example 1 using each sample. Photographs of the general views of the electrode patterns are shown in FIGS. 1 to 5. The reflectance of each paste is shown in FIG. 6.

As shown in FIG. 1, the pattern formed using Sample 1, which does not contain an ultraviolet absorber, demonstrated line width which was much greater than the photomask size.

Figure 2:
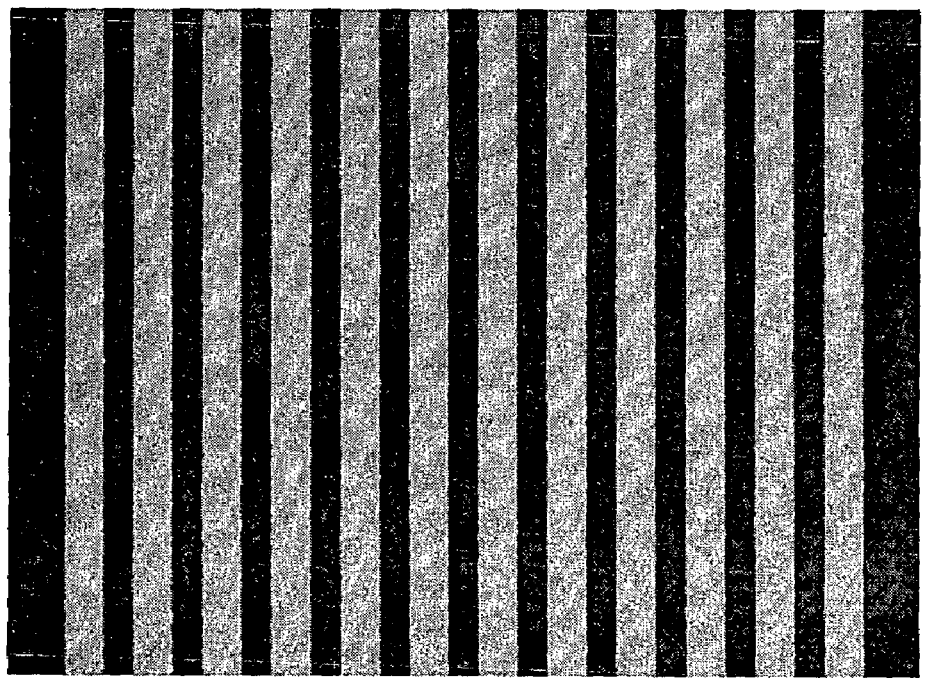
FIG. 2 is a photograph showing a general view of an electrode pattern formed using Sample 2.

As shown in FIG. 2, the pattern formed using Sample 2 of the present invention containing an ultraviolet absorber demonstrated a pattern formed to the desired size. In addition, the pattern was confirmed to be free of discoloration and defects.

Figure 3:
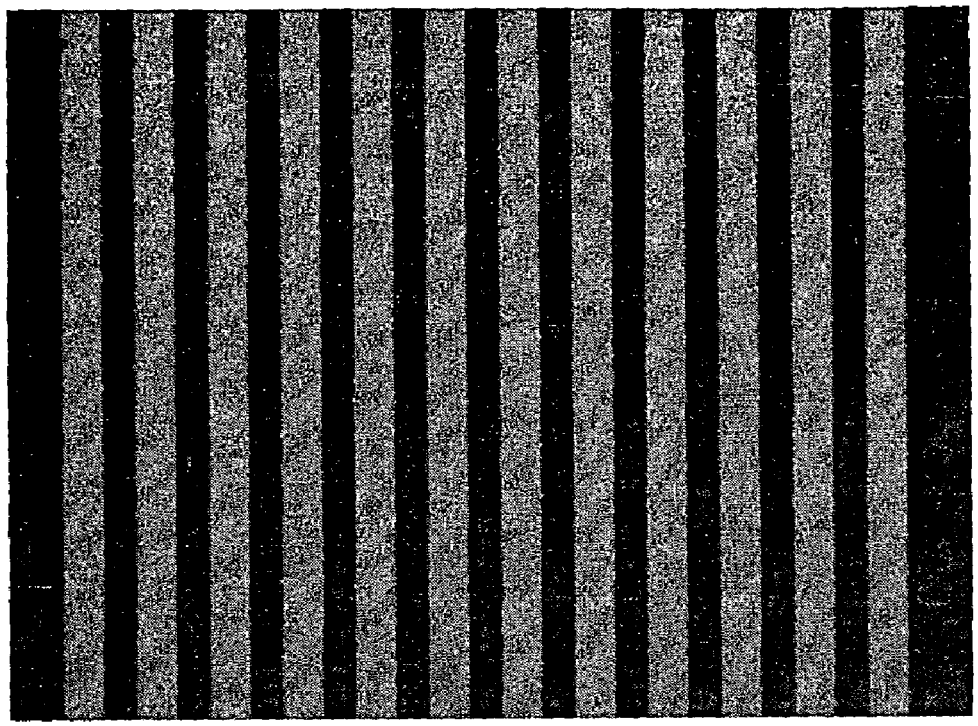
FIG. 3 is a photograph showing a general view of an electrode pattern formed using Sample 3.

As shown in FIG. 3, Sample 3, which contained a dye (Basic Blue 7) for the ultraviolet absorber, demonstrated a favorable pattern width, but was colored blue. In addition, minute areas of dye aggregation were observed.

Figure 4:
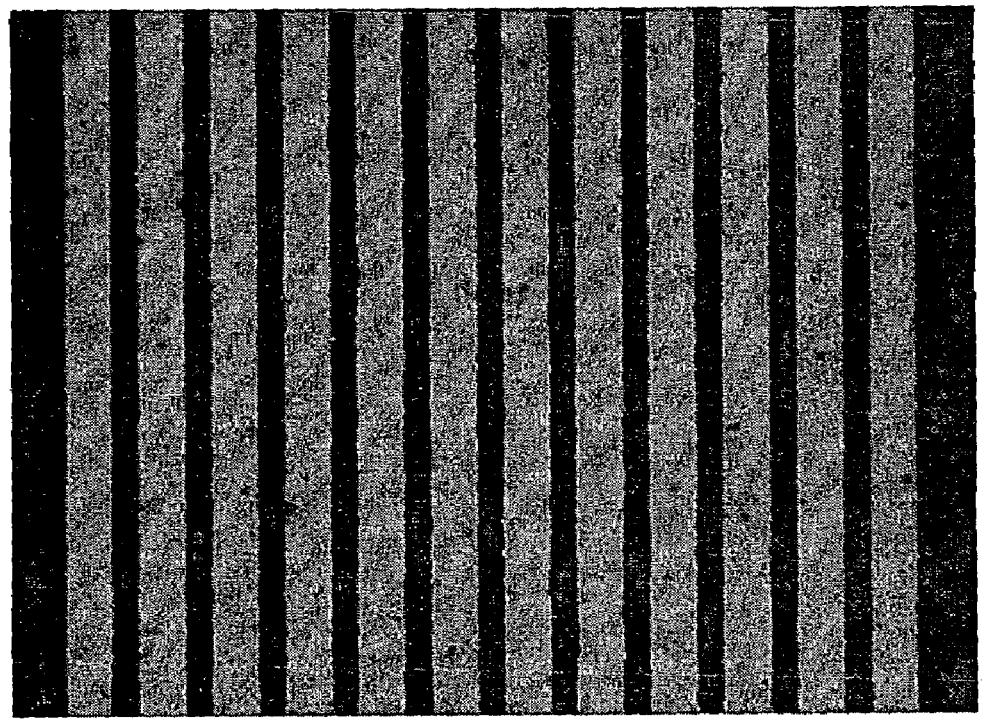
FIG. 4 is a photograph showing a general view of an electrode pattern formed using Sample 4.

As shown in FIG. 4, Sample 4, which contained a dye (Basic Blue 41) for the ultraviolet absorber, demonstrated an increase in pattern width. Moreover, prominent dye aggregation was confirmed.

Figure 5:
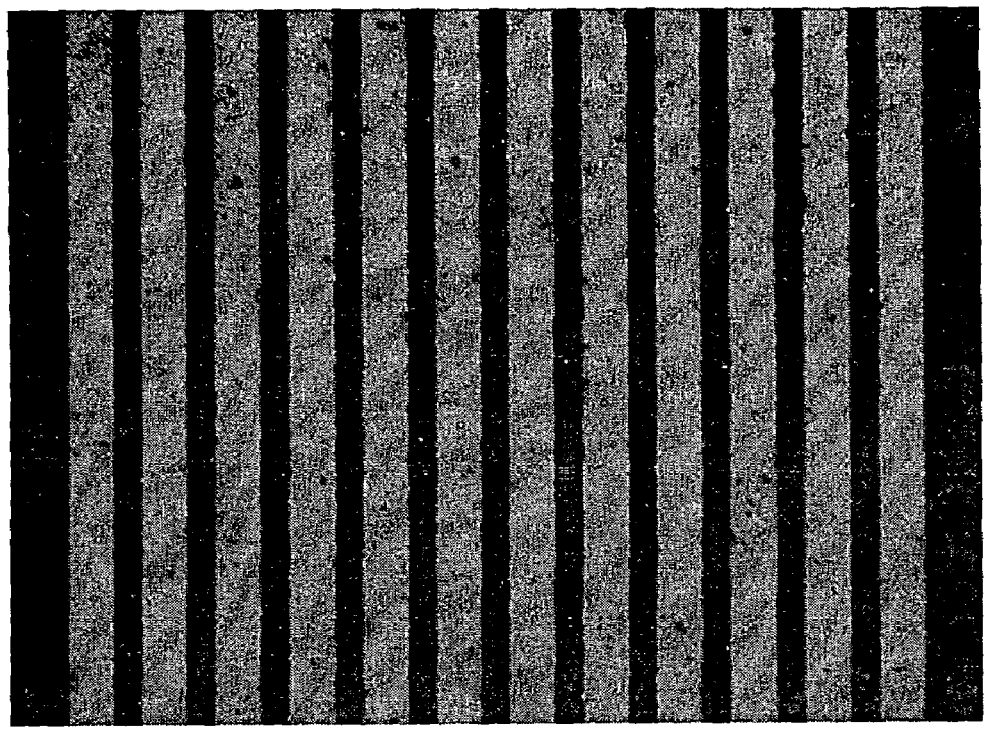
FIG. 5 is a photograph showing a general view of an electrode pattern formed using Sample 5.
Figure 6:
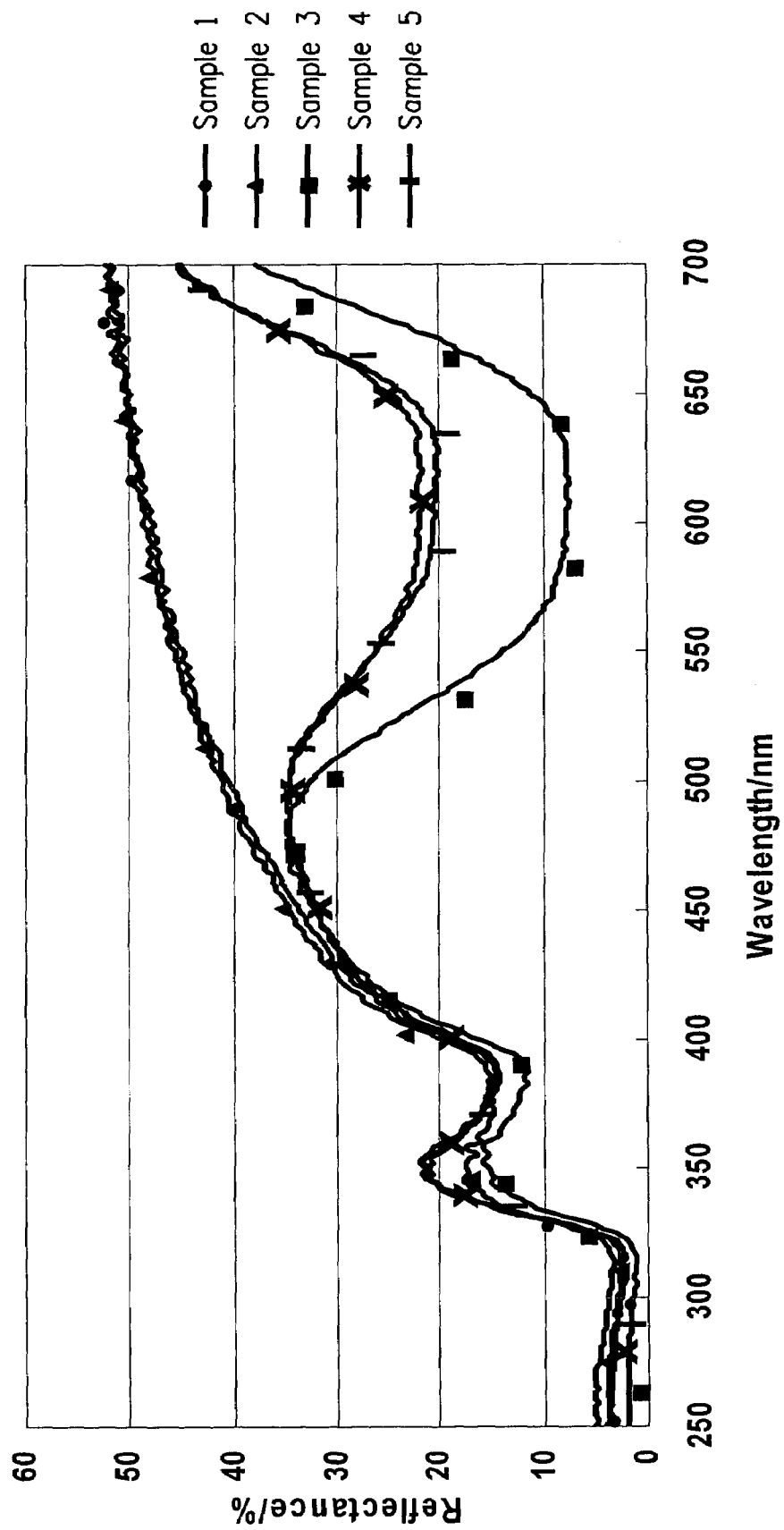
FIG. 6 indicates the reflectance of Samples 1 to 5.

As shown in FIG. 5, Sample 5, which contained a dye (Basic Blue 54) for the ultraviolet absorber, demonstrated an increase in pattern width. Moreover, prominent dye aggregation was confirmed.

As shown in FIG. 6, a paste of the present invention in the form of Sample 2 did not demonstrate a substantial change in the reflectance of the paste in the visible light range even if ultraviolet absorber was added. On the other hand, the reflective spectrum changed considerably in Samples 3 to 5 to which was added a dye-based ultraviolet absorber.

It was suggested from FIGS. 1 to 6 that the use of a paste of the present invention makes it possible to realize high resolution as well as few recognition errors in defect inspections.

What is claimed is:

1. A photosensitive conductive paste for electrode formation comprising: conductive metal particles, a glass binder, a monomer, a photoinitiator, an organic polymer binder, an organic medium and an ultraviolet absorber comprising a benzotriazole derivative or a hydroxyphenyltriazine derivative which does not substantially change reflectance of the paste in a visible light range, wherein when the ultraviolet absorber is a benzotriazole derivative the amount of benzotriazole derivative is 0.1 to 0.5 wt % and when the ultraviolet absorber is a hydroxyphenyltriazine derivative the amount of hydroxyphenyltriazine derivative is 0.2 to 1.0 wt %, based on the overall paste weight.

2. The photosensitive conductive paste for electrode formation according to claim 1, wherein the difference between the reflectance of a paste which does not contain the ultraviolet absorber, and the reflectance of the paste which contains the ultraviolet absorber is less than 5% in the visible light range.

3. The photosensitive conductive paste for electrode formation according to claim 1, wherein the difference between the reflectance of a paste which does not contain the ultraviolet absorber, and the reflectance of the paste which contains the ultraviolet absorber is less than 3% in the visible light range.

4. The photosensitive conductive paste for electrode formation according to claim 1 wherein the conductive metal particles are selected from the group consisting of gold, silver, palladium, platinum, copper and combinations thereof.

5. The photosensitive conductive paste for electrode formation according to claim 4, wherein the conductive metal particles are silver particles.

6. An electrode formed using the conductive paste according to claim 1.

7. A PDP having the electrode according to claim 6.

8. The photosensitive conductive paste of claim 1, wherein the ultraviolet absorber is a benzotriazole derivative and the amount of benzotriazole derivative is 0.15 to 0.25 wt %, based on the overall paste weight.

9. The photosensitive conductive paste of claim 1, wherein the ultraviolet absorber is a hydroxyphenyltriazine derivative and the amount of hydroxyphenyltriazine derivative is 0.3 to 0.5 wt %, based on the overall paste weight.

10. The photosensitive conductive paste of claim 1, wherein the ultraviolet absorber is a 1:1 mixture of octyl-3-[3-tert-butyl-4-hydroxy-5-(5-chloro-2H-benzotriazol-2-yl) phenyl]propionate and 2-ethylhexyl-3-[3-ter-butyl-4-hydroxy-5-(chloro-2H-benzotriazol-2-yl)phenyl]propionate).

11. The photosensitive conductive paste of claim 1, wherein the ultraviolet absorber is 2-(2H-benzotriazol-2-yl)-6-(1-methyl-1-phenylethyl)-4-(1,1,3,3-tetramethylbutyl) phenol).

* * * * *

UNITED STATES PATENT AND TRADEMARK OFFICE
CERTIFICATE OF CORRECTION

PATENT NO. : 7,655,864 B2  Page 1 of 1
APPLICATION NO. : 11/485702
DATED : February 2, 2010
INVENTOR(S) : Sato et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 640 days.

Signed and Sealed this

Thirtieth Day of November, 2010

David J. Kappos
*Director of the United States Patent and Trademark Office*